United States Patent [19]

Oikawa et al.

[11] 4,329,772
[45] May 18, 1982

[54] METHOD FOR MANUFACTURING A SEMICONDUCTOR DEVICE UTILIZING SELECTIVE EPITAXIAL GROWTH AND POST HEAT TREATING

[75] Inventors: Saburo Oikawa; Susumu Murakami, both of Hitachi; Yoshio Terasawa, Katsuta, all of Japan

[73] Assignee: Hitachi, Ltd., Tokyo, Japan

[21] Appl. No.: 134,673

[22] Filed: Mar. 27, 1980

[30] Foreign Application Priority Data

Mar. 30, 1979 [JP] Japan .................. 54-37034

[51] Int. Cl.³ .................. H01L 21/20; H01L 21/223; H01L 29/80
[52] U.S. Cl. .................. 29/571; 29/578; 148/175; 148/187; 148/1.5; 357/22; 357/23; 357/36; 357/55; 357/20
[58] Field of Search .................. 29/571, 578; 148/175, 148/187, 1.5; 357/22, 23, 20, 36, 55, 56

[56] References Cited

U.S. PATENT DOCUMENTS

| | | | |
|---|---|---|---|
| 3,386,865 | 6/1968 | Doo | 148/175 |
| 3,404,450 | 10/1968 | Karcher | 29/577 |
| 3,716,422 | 2/1973 | Ing et al. | 148/175 |
| 3,938,241 | 2/1976 | George et al. | 29/571 |
| 3,999,281 | 12/1976 | Goronkin et al. | 29/571 |
| 4,036,672 | 7/1977 | Kobayashi | 29/571 X |
| 4,067,036 | 1/1978 | Yoshida et al. | 357/22 |
| 4,101,350 | 7/1978 | Possley et al. | 148/175 |
| 4,115,793 | 9/1978 | Nishizawa | 357/22 |
| 4,181,542 | 1/1980 | Yoshida et al. | 29/571 X |

OTHER PUBLICATIONS

Blum et al., "Integrated AlGnAs . . . Memory Cell", IBM Tech. Discl. Bull., vol. 15, No. 2, Jul. 1972, p. 470.

Primary Examiner—L. Dewayne Rutledge
Assistant Examiner—W. G. Saba
Attorney, Agent, or Firm—Craig & Antonelli

[57] ABSTRACT

Disclosed is an improved method of growing an epitaxial layer preventing auto-doping from a doped region exposed to a surface of a semiconductor substrate. A surface of a semiconductor substrate of one conductivity type is covered with a mask having a predetermined opening. Then, impurity atoms are doped into the substrate through the opening to form a region of the other conductivity type. An epitaxial layer of one conductivity type is deposited over the exposed surface of the substrate with another mask which covers the entire surface of the region and has an area larger than that of the exposed surface of the region. The latter mask prevents auto-doping from the region of the other conductivity type. The process is usable for controlling, for example, channel widths of field effect semiconductor devices uniformly and precisely.

6 Claims, 15 Drawing Figures

METHOD FOR MANUFACTURING A SEMICONDUCTOR DEVICE UTILIZING SELECTIVE EPITAXIAL GROWTH AND POST HEAT TREATING

BACKGROUND OF THE INVENTION

This invention relates to a method for causing a growth of an epitaxial layer of one conductivity type free from auto-doping on a semiconductor substrate of which the major surface has thereon a semiconductor region of the one conductivity type and another semiconductor region of the opposite conductivity type arranged side by side in an exposed manner.

A conventional method for manufacturing a semiconductor device such as Field Effect Transistors (FET), Field Controlled Thyristors (FCT), Integrated Circuit (IC) and the like includes the process steps of selectively forming on one main surface of a semiconductor substrate a semiconductor region of the opposite conductivity type to that of the semiconductor substrate and thereafter causing a growth of an epitaxial layer of the same conductivity type as that of the semiconductor substrate, on one major surface of the semiconductor substrate. The method for manufacturing, for example, an FET of the type wherein current vertically flows, includes the steps of selectively forming on one major surface of a semiconductor substrate serving as a drain region of one conductivity type (for example, n-type), a semiconductor region of the opposite conductivity type to that of the drain region serving as a gate region and thereafter causing an epitaxial growth on the drain region of an n-type semiconductor region serving as a source region.

Since in the last-mentioned steps the gate region of said opposite conductivity type is formed in advance of the epitaxial growth of the source region, impurity atoms providing said opposite conductivity type are outdiffused, during the epitaxial growth, from an exposed portion of the gate region into the vapor phase. This causes the occurrence of an auto-doping phenomenon that such impurity atoms are mixed into the source region (epitaxial layer) from the vapor phase. The occurrence of such auto-doping phenomenon causes a reduction in the resistivity of the epitaxial layer, a variation in the resistivity thereof from one place to another, and in an extreme case a failure of the conductivity type of the epitaxial layer to become a desired type. These process steps, therefore, have the drawbacks due to such problems that the resultant semiconductor device fails to have a desired characteristic and that the device fails to be of uniform quality.

A prior art which proposes a means for preventing the occurrence of such auto-doping phenomena is disclosed in U.S. Pat. No. 3,716,422 (issued to D. W. Ing. et al on Feb. 13, 1973). Ing et al suppress the auto-doping phenomena by causing a growth of the epitaxial layer in two different stages. Specifically, a first epitaxial layer is grown on one major entire surface of a semiconductor substrate of one conductivity type and having previously formed thereon partially diffused region having the opposite conductivity type to that of such substrate, and then removal is made of said first epitaxial layer other than that corresponding to the diffused region of said opposite conductivity type. Thereafter, a second epitaxial layer is grown on the exposed surface of the semiconductor substrate and remaining first epitaxial layer, to a desired thickness.

According to Ing et al at the time of growth of the first epitaxial layer auto-doping indeed occurs due to the outdiffusion of impurity atoms from the diffused region of said opposite conductivity type into the vapor phase. Since the first epitaxial layer is selectively removed in such a manner that only the exposed surface of the diffused region of said opposite conductivity type remains to be covered by the first epitaxial layer, the auto-doping attributable to the diffused region of said opposite conductivity type can be prevented at the time of growth of the second epitaxial layer.

However, since in the Ing et al method the second epitaxial layer is grown with part of the first epitaxial layer left on the exposed surface of the diffused region, it is difficult to prevent the auto-doping from such part of the first epitaxial layer, which auto-doping, though occurring only slightly, is a serious matter for a semiconductor device which should be precisely fabricated. Further, since according to the Ing et al method the epitaxial layer is grown in two different steps, the steps for making the semiconductor device becomes unavoidably complicated. Further, it is difficult to have the second epitaxial layer selectively grown. This is disadvantageous for the manufacture of a semiconductor device of the type wherein electrodes, for example, are formed on the second epitaxial layer and on the diffused region, respectively.

SUMMARY OF THE INVENTION

Accordingly, an object of the invention is to provide a method for manufacturing a semiconductor device which is capable of causing the growth of an epitaxial layer free from auto-doping.

Another object of the invention is to provide a method for manufacturing a semiconductor device which is capable of causing the selective growth of an epitaxial layer free from auto-doping.

Still another object of the invention is to provide a method for manufacturing with high reproducibility field effect (or controlled) semiconductor devices of which channel width is controlled precisely.

One feature of the invention is to form, in a semiconductor layer of one conductivity type exposed in one major surface of a semiconductor substrate, a semiconductor region of the opposite conductivity type to that of the semiconductor layer, then to form a mask covering an exposed portion of the semiconductor region of said opposite conductivity type, and thereafter to cause an epitaxial layer of the one conductivity type to be grown on one exposed major surface portion of said semiconductor substrate. According to the invention, preferably the epitaxial layer of the one conductivity type is selectively grown by properly selecting the material quality of the mask and the necessary requirements for epitaxial growth.

Another feature of the invention is to cause the epitaxial layer to be grown by using the mask, and thereafter to perform such a heat treatment that causes the semiconductor region of the opposite conductivity type of which surface is covered with the mask to be spread into the epitaxial layer to form a buried region within the epitaxial layer.

Other objects and feature of the invention will become apparent from the following descriptions taken in connection with the accompanying drawings.

DESCRIPTION OF THE PREFERRED EMBODIMENTS

Description will now be made of preferred embodiments of this invention. The steps illustrated FIGS. 1a–1h are an embodiment of the manufacturing method of the invention, and are sequentially illustrated in respect of the partially sectional structure of a field controlled thyristor (FCT).

Figure 1A:
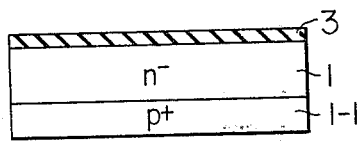
FIGS. 1a through 1h are flow diagrams which illustrate a method for manufacturing a semiconductor device according to an embodiment of the invention.

As illustrated in FIG. 1a, a p-type high concentration layer 1—1 finally providing an anode layer is formed, by the method of diffusion, on one surface (lower face) of an n-type silicon substrate 1 having a resistivity of about 50 to 200 $\Omega$·cm. Further, a silicon oxide film 3 is formed, by deposition, on the other surface (upper surface) of the n-type semiconductor substrate.

Figure 1E:
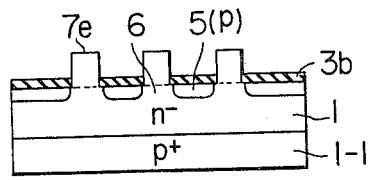
Figure 1B:
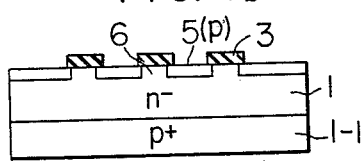

Next, as illustrated in FIG. 1b, a number of rectangular patterns whose long sides are parallel to each other are formed by partially removing the silicon oxide film 3 by usual photo-etching technique. Subsequently, a p-type impurity is diffused into the silicon substrate 1 with the silicon oxide film 3 used as a diffusion mask, thereby to form a channel region 6 sandwiched between the adjacent gate regions 5.

At the time of forming the gate regions 5, the p-type impurity is vertically diffused into the silicon substrate 1 and is also horizontally diffused substantially by the same distance as that by which such vertical diffusion is made. Accordingly, in the step of FIG. 1b the p-type impurity is also diffused right under the silicon oxide film 3, so that the resultant pn junction partially extends beyond the peripheral portion of the mask.

Conventionally, when such epitaxially grown layer providing a source region is formed, as described above, with such horizontally diffused p-type impurity region kept exposed, auto-doping action occurs to have an undesirable effect upon the n-type channel. It is difficult to restrict such an auto-doping to cause the undesirable effect. The method for manufacturing a semiconductor device according to the invention is characterized by first causing the substrate surface to be entirely free from the exposure thereon of such p-type impurity region and then forming an epitaxial layer on the substrate surface.

Figure 1F:
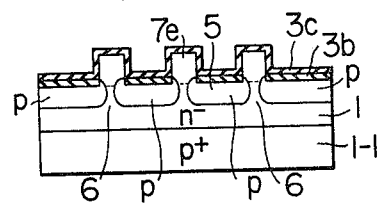
Figure 1C:
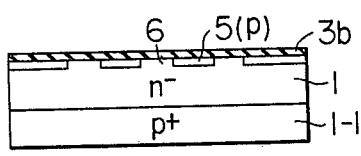

In the step of FIG. 1c, the silicon oxide film 3 used as the diffusion mask is once totally removed and then a new silicon oxide film 3b is formed on the semiconductor substrate. Subsequently, the new silicon oxide film 3b is selectively removed to such an extent that the entire surface of the gate regions 5 and a slightly outer portion of the channel regions 6 is kept covered with the silicon oxide film 3b, (See FIG. 1d).

Figure 1G:
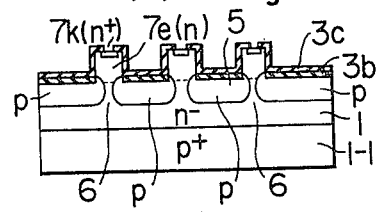
Figure 1D:
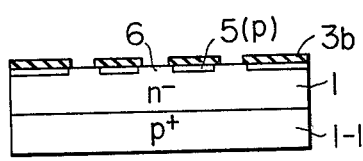
Figure 2:
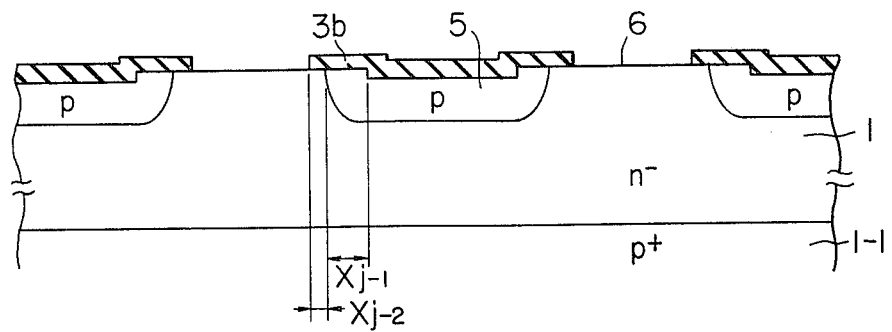
FIG. 2 is an enlarged view illustrating in detail a semiconductor substrate in the step of flow diagram of FIG. 1d.

This step of fabrication is carried out by, as shown in FIG. 2 as an enlargement of the FIG. 1d semi-product, having the new silicon oxide film 3b so either as to permit the film to extend slightly beyond the surface of the gate region 5 to thereby to wholly cover the gate region 5 and then by removing by the photo-etching method the portion of the new silicon oxide film 3b extending over a region becoming the channel region 6.

It should be noted that the amount of the new silicon oxide film 3b sufficient to wholly cover the gate region 5 corresponds to the sum of a gate region portion $x_{j\text{-}1}$ spread by the horizontal diffusion referred to in connection with FIG. 1b and a gate region portion $x_{j\text{-}2}$ horizontally spread by the heat treatment which is thereafter carried out for the formation of an epitaxial layer. Namely, the new silicon oxide film 3b wholly covers the gate region 5 being finally spread or formed.

Figure 3:
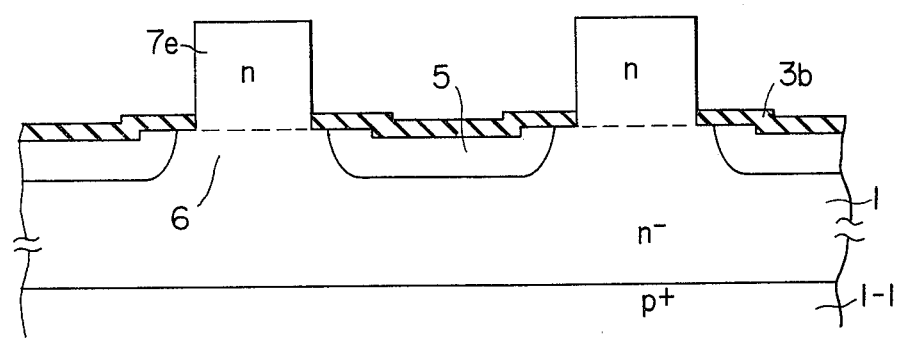
FIG. 3 is an enlarged view illustrating in detail a semiconductor substrate and an epitaxial layer in the step of flow diagram of FIG. 1e.

On the substrate surface having the gate region 5 thus completely covered with the new silicon oxide film 3b is provided an n-type epitaxially grown layer 7e by the epitaxial growth method, as shown in FIG. 1e. In order that at the time of such an epitaxial growth a poly-crystalline silicon layer may be prevented from being grown on the new silicon oxide film 3b covering the gate region 5, a minute amount of HCl gas, i.e. about 0.5% by volume of HCl gas, preferably is mixed into the raw material gas for the epitaxial growth. FIG. 3 is a partially enlarged view of the semiconduct obtained after the formation thereon of the n-type epitaxially grown layer 7e illustrated in FIG. 1e. As seen from FIG. 3, the invention thus enables the formation of the n-type source region or epitaxially grown layer 7e without causing the occurrence of any auto-doping action.

Then, as illustrated in FIG. 1f, the semiconductor substrate surface having the epitaxial growth layer 7e thus formed thereon is further covered with a silicon oxide film 3c and thereafter the resultant product is subjected to a heat treatment so as to permit the channel region 6 to have a desired width.

Figure 4:
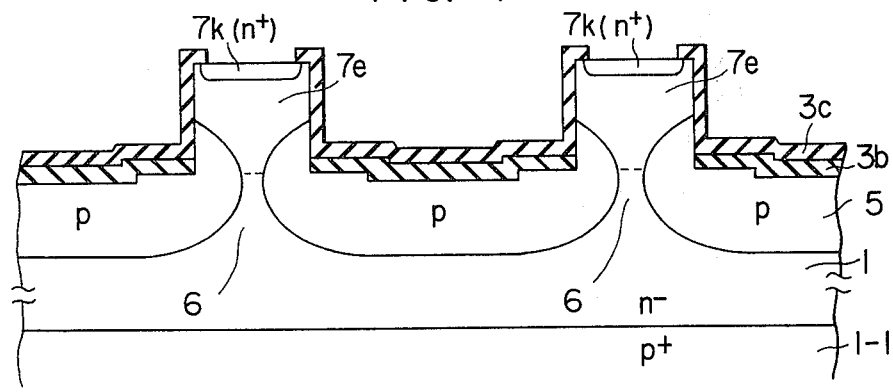
FIG. 4 is an enlarged view illustrating a semiconductor substrate and an epitaxial layer in the step of flow diagram of FIG. 1g.

The cross section of the semiconductor substrate obtained after the heat treatment is shown in FIG. 4. The boron atoms which are contained in the gate region 5 are diffused by the heat treatment into the environmental area of the gate region 5, so that the gate region 5 is spread until it is partially extended into the epitaxial layer 7e, and the channel width becomes narrower than the width of the epitaxial layer. In this embodiment, fabrication is made so that the width $W_1$ of the epitaxial layer is about 100 $\mu$m and the width $W_2$ of the channel is about 5 $\mu$m. In the embodiment, the gate region 5 is chosen to have an impurity concentration of about $1 \times 10^{18}$ atoms/cm$^3$.

Figure 1H:
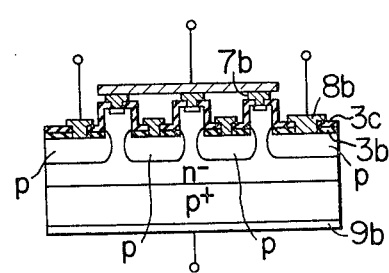

Thereafter, as shown in FIG. 1g, after removing by the photo-etching method part of the silicon oxide film 3c on the n-type epitaxial growth layer 7e, n-type cathode layers 7k of high impurity concentration are formed by diffusion and by using the silicon oxide film as a mask, in the area corresponding to the removed part of the silicon oxide film 3c. Subsequently, the silicon oxide films 3c and 3b covering the surface of a gate region 5, are partially removed together by the photo-etching method. Thereafter, a desired FCT is obtained by forming, as shown in FIG. 1h, a cathode electrode 7b connecting the cathode layers, a gate electrode 8b connecting the gate regions 5, and an anode electrode 9b.

Figure 5:
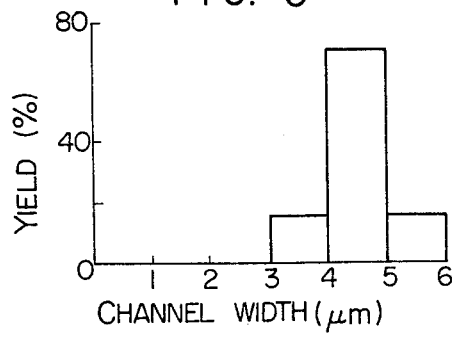
FIG. 5 is a graphic diagram illustrating the yield of a channel width according to the process of the invention which is obtained when the channel width is set at 5 $\mu$m.

FIG. 5 illustrates the control yield concerning the channel width $W_2$ of the product according to the above-mentioned embodiment. In the embodiment, the channel width $W_2$ was set at 5 $\mu$m. As seen from FIG. 5, there has been obtained a control yield of about 70% with respect to the channel width $W_2$. The channel widths of the remaining products each fall within the range of 5 $\mu$m±1 $\mu$m in terms of their control yield.

Figure 6:
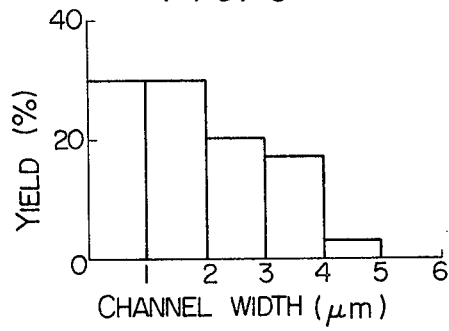
FIG. 6 is a graphic diagram illustrating the yield of a channel width according to a control process for the process of the invention which is obtained when a design value of the channel width is 5 $\mu$m.

FIG. 6 illustrates the control yield concerning the channel width $W_2$ of the product (which corresponds to the product using the mask without its portions respectively corresponding to $X_{j-1}$ and $X_{j-2}$ of FIG. 2) which has the FIG. 1d silicon oxide film 3b formed on the substrate surface portions other than those covered with the silicon oxide film 3 in the stage of FIG. 1b. Also in this case, the channel width $W_2$ of that product is set at 5 $\mu$m. In the case of the FIG. 6, the control yield in which the channel width $W_2$ becomes 5 $\mu$m is as small as 5% or less, which is due to the auto-doping action. Further, the channel widths are distributed widely.

Figure 7:
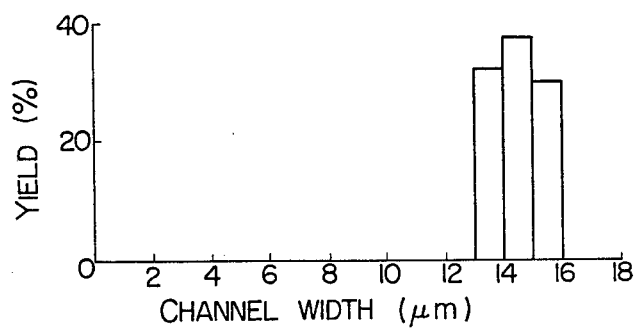
FIG. 7 is a graphic diagram illustrating the yield of a channel width according to the process of the invention which is obtained the channel width is set at 15 $\mu$m.

FIG. 7 shows a control yield of the channel width $W_2$ when the design value of the $W_2$ is 15 $\mu$m in the above-mentioned embodiment. The figure shows that embodiment attains a high, satisfactory yield, as in the case of FIG. 5.

Figure 8:
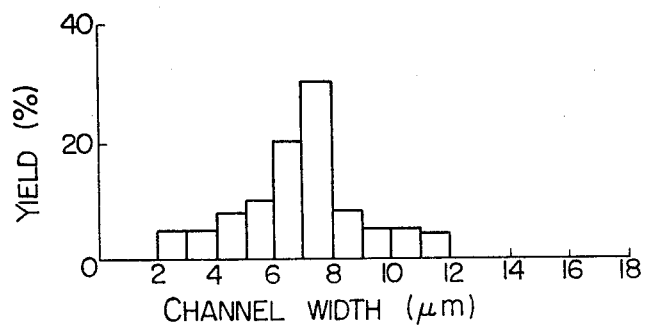
FIG. 8 is a graphic diagram illustrating the yield of a channel width according to a control process for the process of the invention which is obtained when the channel width is at 15 $\mu$m.

FIG. 8 shows a control yield of the channel width $W_2$ in a comparative example using the silicon oxide layer 3b as in the case of FIG. 6, when the channel width $W_2$ has 15 $\mu$m of the design value. FIG. 8 shows that the auto-doping provides 0% of the yield of the channel width $W_2$ becoming 15 $\mu$m, and that the channel widths are distributed widely.

In FCT or FET, the control of the channel width is a very important factor for determining its characteristic and performances at the ON and OFF times. In the FCT or FET having an uneven channel width, the load current concentrates onto a portion thereof with a wide channel width and a low resistivity, so that the semiconductor element is weak at the portion, and that characteristics of the semiconductor elements fabricated vary.

The semiconductor device such as FCT or FET fabricated by the method of the invention is substantially free from auto-doping and therefore is uniform in the channel width.

The FCT as mentioned above properly selects the thickness of the gate region 5 and the impurity concentration thereof whereby a part of the gate region 5 is also used as a major load current passage between the cathode electrode 7b and the anode electrode 9b. The load current path of this embodiment includes a diode structure having the cathode layer 7k, the epitaxial layer 7e, the channel 6, the n-type substrate 1 and the anode layer 1—1, and the thyristor structure having the cathode layer 7k, the epitaxial layer 7e, the gate region 5, the n-type substrate 1, and the anode layer 1—1. Such a construction for the current path expands the current path to provide an FCT with a large current capacity. To this end, it is preferable that the thickness of the gate region 5 is within a range of 30 to 60 $\mu$m and the impurity concentration is $1 \times 10^{18}$ atoms/cm$^3$ or less.

Increasing the impurity concentration of the gate region 5 to about $10^{20}$ atoms/cm$^3$ allows the use of only the diode structure for the current path.

The present invention, which has been described with the application of it to the FCT is applicable for other suitable semiconductor devices. For example, the replacement of the anode layer 1—1 of the FCT by an n-type semiconductor layer may form an FET.

The above-mentioned embodiment, which is designed to mix HCl gas into the gas mixture at the time of the growth of the epitaxial layer 7e so as to prevent poly-crystalline silicon from growing on the silicon oxide layer 3b, may be so modified that poly-crystalline silicon is grown without HCl gas and it is removed by the etching later.

The cathode layer 7k may be grown by the epitaxial layer 7e.

We claim:

1. A method of making a semiconductor device comprising the steps of:
    preparing a semiconductor substrate having a main surface and a semiconductor layer therein of one conductivity type adjacent to said main surface;
    covering said main surface of said semiconductor substrate with a first mask having an opening which exposes a portion of said semiconductor layer;
    doping impurity atoms into said semiconductor layer through said opening of said first mask to make a first semiconductor region of another conductivity type opposite to said one conductivity type in said semiconductor layer;
    selectively covering the main surface of said semiconductor substrate with a second mask to cover the entire exposed surface of said first semiconductor region and an adjacent outer portion of the semiconductor layer provided in said main surface and to expose another portion of the semiconductor layer on the main surface whereby the another portion of the semiconductor layer is left uncovered;
    depositing a second semiconductor region of said one conductivity type epitaxially on the exposed portion of said semiconductor layer not covered with second mask; and
    heating said semiconductor substrate to cause diffusion of said impurity atoms outwardly from said first semiconductor region to enlarge said first semiconductor region into a portion of the semiconductor layer and into a portion of the second semiconductor region, the second mask preventing auto-doping of said impurity atoms from said first semiconductor region into said second semiconductor region during deposition of said second semiconductor region, and the width of the second semiconductor region being controllably reduced.

2. A method as claimed in claim 1, wherein said second mask is made of silicon dioxide and said depositing step is carried out in a gaseous mixture containing a gaseous compound of said semiconductor and hydrogen chloride.

3. A method making a Field Controlled Thyristor comprising the steps of:

preparing a semiconductor substrate having a pair of opposing main surfaces and a stack structure of semiconductor areas therebetween which includes a first semiconductor area of one conductivity type adjacent to one of said main surfaces and a second semiconductor area of another conductivity type opposite to said one conductivity type adjacent to the other main surface of said first semiconductor area;

covering said one of the main surfaces of said semiconductor substrate with a first mask having an opening which exposes a portion of said first semiconductor area;

doping impurity atoms into said first semiconductor area through said opening of said first mask to make a first semiconductor region of said another conductivity type in said one semiconductor area;

selectively covering said one of the main surfaces of said semiconductor substrate with a second mask to cover the entire exposed surface of said first semiconductor region and an adjacent outer portion of the first semiconductor area and to expose another portion of the first semiconductor area whereby the another portion of the first semiconductor area is left uncovered;

depositing a second semiconductor region of said one conductivity type epitaxially on the exposed portion of said first semiconductor area not covered with said second mask to form a channel region of the Field Controlled Thyristor; and heating said semiconductor substrate to cause diffusion of said impurity atoms outwardly from said first semiconductor region to enlarge said first semiconductor region into a portion of the first semiconductor area and into a portion of the second semiconductor region, the second mask preventing auto-doping of said impurity atoms from said first semiconductor region into said second semiconductor region during deposition of said second semiconductor region, and the width of the second semiconductor region being controllably reduced.

4. A method as claimed in claim 3, wherein said first semiconductor region has an impurity concentration of not more than $1 \times 10^{18}$ atoms/cm$^3$ in the portion enlarged within said second semiconductor region after said heating step.

5. A method as claimed in claim 3, wherein said width of said second semiconductor region is reduced to not more than 15 μm after said heating step.

6. A method as claimed in claim 3, wherein a plurality of said second semiconductor regions are formed.

* * * * *